US009243328B2

(12) United States Patent
Furuta et al.

(10) Patent No.: US 9,243,328 B2

(45) Date of Patent: Jan. 26, 2016

(54) SUSCEPTOR WITH ROLL-FORMED SURFACE AND METHOD FOR MAKING SAME

(75) Inventors: Gaku Furuta, Sunnyvale, CA (US); David Atchley, Livermore, CA (US); Soo Young Choi, Fremont, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 576 days.

(21) Appl. No.: 12/407,766

(22) Filed: Mar. 19, 2009

(65) Prior Publication Data

US 2009/0238734 A1 Sep. 24, 2009

Related U.S. Application Data

(60) Provisional application No. 61/038,050, filed on Mar. 20, 2008.

(51) Int. Cl.
*B01J 19/08* (2006.01)
*C23C 16/458* (2006.01)

(52) U.S. Cl.
CPC .................................. *C23C 16/4581* (2013.01)

(58) Field of Classification Search
CPC ........................ B01J 19/088; B01J 2219/0877
USPC .................. 422/186, 186.14, 186.01, 186.03, 422/186.04
See application file for complete search history.

(56) References Cited

U.S. PATENT DOCUMENTS

| | | | |
|---|---|---|---|
| 6,089,182 A * | 7/2000 | Hama | 118/723 I |
| 6,634,882 B2 | 10/2003 | Goodman | |
| 2002/0124964 A1 | 9/2002 | Ahn | |
| 2004/0206062 A1* | 10/2004 | Ichikawa | 55/523 |
| 2004/0221959 A1* | 11/2004 | Choi et al. | 156/345.51 |
| 2006/0032586 A1 | 2/2006 | Choi et al. | |
| 2006/0185795 A1 | 8/2006 | Choi et al. | |
| 2007/0089670 A1* | 4/2007 | Ikedo | 118/50 |
| 2007/0178810 A1 | 8/2007 | Choi et al. | |
| 2008/0131622 A1 | 6/2008 | White et al. | |

FOREIGN PATENT DOCUMENTS

| | | |
|---|---|---|
| JP | 10340896 | 12/1998 |
| JP | 2004342834 A | 12/2004 |
| JP | 2007-158286 A | 6/2007 |
| JP | 2007152370 A | 6/2007 |
| JP | 2007168245 A | 7/2007 |
| JP | A116150 A | 10/2007 |
| KR | 2006-0129566 A | 12/2006 |

OTHER PUBLICATIONS

PCT international search report and written opinion of PCT/US2009/037557 dated Aug. 25, 2009. Provides concise statement of relevance for KR-10-1998-022560.

(Continued)

*Primary Examiner* — Natalia Levkovich
(74) *Attorney, Agent, or Firm* — Patterson & Sheridan, LLP

(57) ABSTRACT

The present invention generally provides apparatus for supporting a large area substrate in a plasma reactor. One embodiment, a substrate support for using in a plasma reactor includes an electrically conductive body has a top surface with a plurality of roll-formed indents.

15 Claims, 9 Drawing Sheets

(56) References Cited

OTHER PUBLICATIONS

Official Letter dated Feb. 28, 2012, from China Patent Office for corresponding Chinese Patent Application No. 200980109686.5.

Official Letter dated Mar. 5, 2013 from the Japanese Patent Office for corresponding Japanese Patent Application No. 2011-500934.

Official Letter dated Dec. 4, 2013, from China Patent Office for corresponding Chinese Patent Application No. 200980109686.5.

Official Letter dated Jan. 29, 2014, from Taiwan Patent Office for corresponding Taiwan Patent Application No. 98109276.

* cited by examiner 100
102
104
106
108
110
112
114
116
118
120
122
124
126
128
130
132
138
140
142
144
146
148
150
160
164
166
180
182
184

SUSCEPTOR WITH ROLL-FORMED SURFACE AND METHOD FOR MAKING SAME

CROSS-REFERENCE TO RELATED APPLICATION

This application claims benefit of U.S. Provisional Application No. 61/038,050, filed Mar. 20, 2008, which is incorporated by reference in its entirety.

BACKGROUND OF THE INVENTION

1. Field of the Invention

Embodiments of the present invention generally relate to an apparatus and method for processing large area substrates. More particularly, embodiments of the present invention relate to a substrate support for supporting large area substrates in semiconductor processing and a method of fabricating the same.

2. Description of the Related Art

Equipment for processing large area substrates has become a substantial investment in manufacturing of flat panel displays including liquid crystal displays (LCDs) and plasma display panels (PDPs), organic light emitting diodes (OLEDs), and solar panels. A large area substrate for manufacturing LCD, PDP, OLED or solar panels may be a glass or a polymer workpiece.

The large area substrate is typically subjected to a plurality of sequential processes to created devices, conductors, and insulators thereon. Each of these processes is generally performed in a process chamber configured to perform a single step of the production process. In order to efficiently complete the entire sequential processes, a number of process chambers are typically used. One fabrication process frequently used to process a large area substrate is plasma enhanced chemical vapor deposition (PECVD).

PECVD is generally employed to deposit thin films on a substrate such as a flat panel substrate or a semiconductor substrate. PECVD is typically performed in a vacuum chamber between parallel electrodes positioned several inches apart, typically with a variable gap for process optimization. A substrate being processed may be disposed on a temperature controlled substrate support disposed in the vacuum chamber. In some cases, the substrate support may be one of the electrodes. A precursor gas is introduced into the vacuum chamber and is typically directed through a distribution plate situated near the top of the vacuum chamber. The precursor gas in the vacuum chamber is then energized or excited into a plasma by applying a RF power coupled to the electrodes. The excited gas reacts to form a layer of material on a surface of the substrate positioned on the substrate support. Typically, a substrate support or a substrate support assembly in a PECVD chamber is configured to support and heat the substrate as well as serve as an electrode to excite the precursor gas.

Generally, large area substrates, for example those utilized for flat panel fabrication, are often exceeding 550 mm×650 mm, and are envisioned up to and beyond 4 square meters in surface area. Correspondingly, the substrate supports utilized to process large area substrates are proportionately large to accommodate the large surface area of the substrate. The substrate supports for high temperature use typically are casted, encapsulating one or more heating elements and thermocouples in an aluminum body. Due to the size of the substrate support, one or more reinforcing members are generally disposed within the substrate support to improve the substrate support's stiffness and performance at elevated operating temperatures (i.e., in excess of 350 degrees Celsius and approaching 500 degrees Celsius to minimize hydrogen content in some films). The aluminum substrate support is then anodized to provide a protective coating.

Although substrate supports configured in this manner have demonstrated good processing performance, two problems have been observed. The first problem is non-uniform deposition. Small local variations in film thickness, often manifesting as spots of thinner film thickness, have been observed which may be detrimental to the next generation of devices formed on large area substrates. It is believed that variation in substrate thickness and flatness, along with a smooth substrate support surface, typically about 50 micro-inches, creates a local capacitance variation in certain locations across the glass substrate, thereby creating local plasma non-uniformities that result on deposition variation, e.g., spots of thin deposited film thickness.

The second problem is caused by the static charge generated by the triboelectric process, or the process of bringing two materials into contact with each other and then separating them from each other. As a result, electrostatics may build up between the substrate and the substrate support making it difficult to separate the substrate from the substrate support once the process is completed.

An additional problem is known in the industry as the electro-static discharge (ESD) metal lines arcing problem. As the substrate size increased, the ESD metal lines become longer and larger. It is believed that the inductive current in the ESD metal lines becomes large enough during plasma deposition to damage the substrate. This ESD metal lines arcing problem has become a major recurring problem.

Therefore, there is a need for an improved substrate support.

SUMMARY

The present invention generally provides apparatus for supporting a large area substrate in a plasma reactor. One embodiment, a substrate support for using in a plasma reactor includes an electrically conductive body has a top surface with a plurality of roll-formed indents.

A plasma reactor is also provided. In another embodiment, a plasma includes a chamber body having a process volume. A showerhead is disposed in the process volume and configured to direct flow of provide process gases into the process volume. An aluminum body is disposed in the process volume below the showerhead. A heater disposed in the aluminum body. The aluminum body has a top surface containing roll-formed indents.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
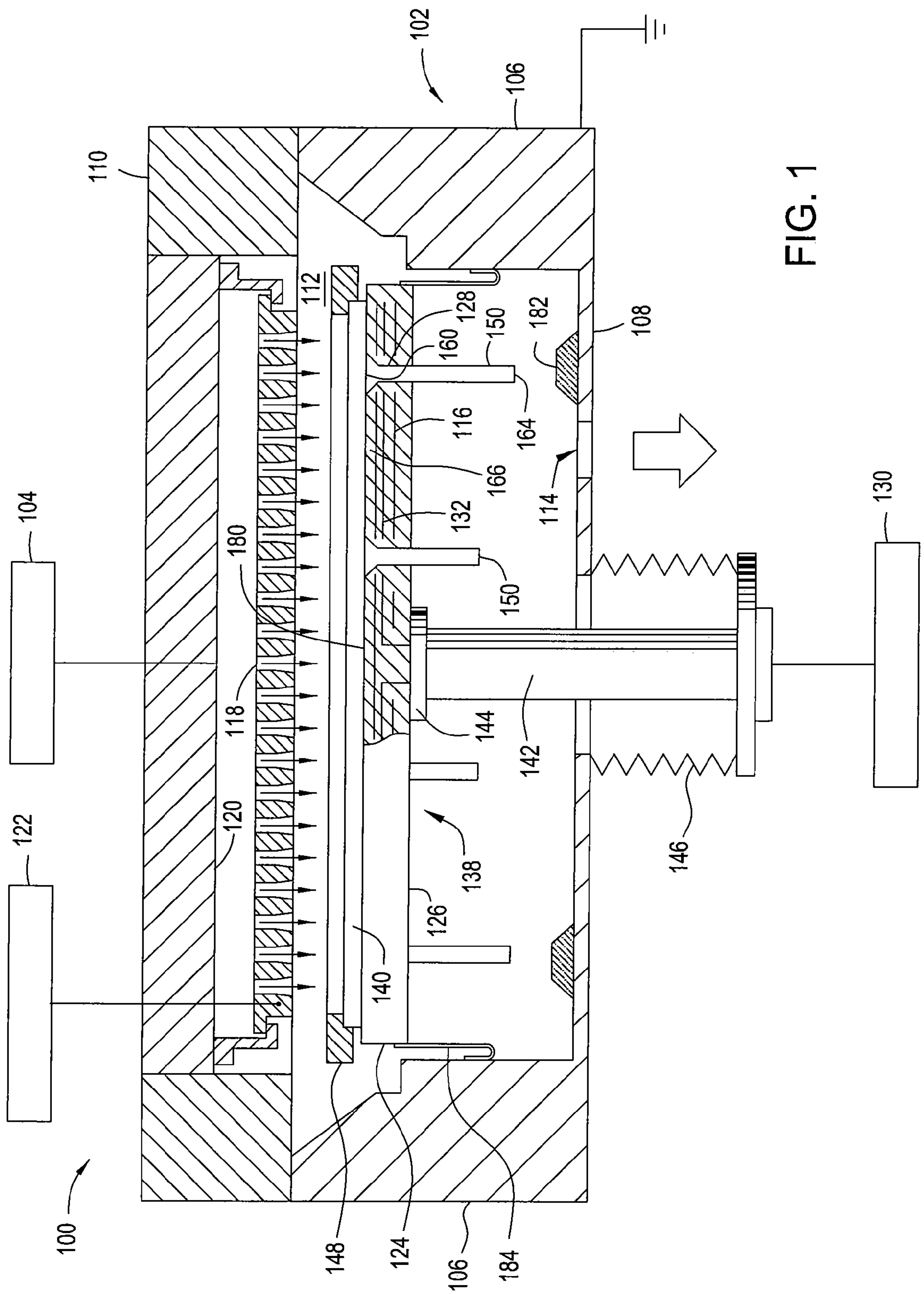
FIG. 1 schematically illustrates a cross sectional view of a plasma enhanced chemical vapor deposition chamber having one embodiment of a substrate support.

To facilitate understanding, identical reference numerals have been used, where possible, to designate identical elements that are common to the figures. It is to be noted, however, that the appended drawings illustrate only typical embodiments of this invention and are therefore not to be considered limiting of its scope, for the invention may admit to other equally effective embodiments.

DETAILED DESCRIPTION

The present invention relates to a substrate support that provides necessary capacitive decoupling to a substrate being processed and methods of making the substrate support. Particularly, the substrate support of the present invention reduces the electrostatics between the substrate and the substrate support and to minimize plasmoid which usually appears with damaged substrates. Although not wishing to be bound by theory, it is believed that intensive plasma over metal lines on a large area substrate heats the large area substrate unevenly causing thermal stress in the large area substrate. The thermal stress in the large area substrate may build up large enough to fracture the large area substrate. Once the non-conductive large area substrate is broken, the conductive substrate support is exposed to the plasma, arcing, or plamoid, occurs. The substrate support of the present invention reduces electrostatics, minimizes plasmoid, as well as provides good film deposition performance.

FIG. 1 schematically illustrates a cross sectional view of a plasma enhanced chemical vapor deposition (PECVD) system 100 in accordance with one embodiment of the present invention. The PECVD system 100 is configured to form structures and devices on a large area substrate, for example, a large area substrate for use in the fabrication of liquid crystal displays (LCDs), plasma display panels (PDPs), organic light emitting diodes (OLEDs), and solar panels. The large area substrate being processed may be a glass substrate or a polymer substrate.

The PECVD system 100 generally includes a chamber 102 coupled to a gas source 104. The chamber 102 comprises chamber walls 106, a chamber bottom 108 and a lid assembly 110 that define a process volume 112. The process volume 112 is typically accessed through a port (not shown) formed in the chamber walls 106 that facilitates passage of a large area substrate 140 (hereafter substrate 140) into and out of the chamber 102. The substrate 140 may be a glass or polymer workpiece. In one embodiment, the substrate 140 has a plan surface area greater than about 0.25 square meters. The chamber walls 106 and chamber bottom 108 are typically fabricated from a unitary block of aluminum or other material compatible for plasma processing. The chamber walls 106 and chamber bottom 108 are typically electrically grounded. The chamber bottom 108 has an exhaust port 114 that is coupled to various pumping components (not shown) to facilitate control of pressure within the process volume 112 and exhaust gases and byproducts during processing.

In the embodiment depicted in FIG. 1, the chamber 102 has an RF power source 122 coupled thereto. The RF power source 122 is coupled to a gas distribution plate 118 to provide an electrical bias that energizes process gas provided by the gas source 104 and sustains a plasma formed from process gas in the process volume 112 below the gas distribution plate 118 during processing.

The lid assembly 110 is supported by the chamber walls 106 and can be removed to service the chamber 102. The lid assembly 110 is generally comprised of aluminum. The gas distribution plate 118 is coupled to an interior side 120 of the lid assembly 110. The gas distribution plate 118 is typically fabricated from aluminum. The center section of the gas distribution plate 118 includes a perforated area through which process gases and other gases supplied from the gas source 104 are delivered to the process volume 112. The perforated area of the gas distribution plate 118 is configured to provide uniform distribution of gases passing through the gas distribution plate 118 into the chamber 102. Detailed description of the gas distribution plate 118 may be found in U.S. patent application Ser. No. 11/173,210 filed Jul. 1, 2005, entitled, "Plasma Uniformity Control by Gas Diffuser Curvature" and U.S. patent application Ser. No. 11/188,922 filed Jul. 25, 2005, entitled "Diffuser Gravity Support", which are hereby incorporated by reference.

A substrate support assembly 138 is centrally disposed within the chamber 102. The substrate support assembly 138 is configured to support the substrate 140 during processing. The substrate support assembly 138 generally comprises an electrically conductive body 124 supported by a shaft 142 that extends through the chamber bottom 108.

The substrate support assembly 138 is generally grounded such that RF power supplied by the RF power source 122 to the gas distribution plate 118 (or other electrode positioned within or near the lid assembly of the chamber) may excite the gases disposed in the process volume 112 between the substrate support assembly 138 and the gas distribution plate 118. The RF power from the RF power source 122 is generally selected commensurate with the size of the substrate to drive the chemical vapor deposition process. In one embodiment, the conductive body 124 is grounded through one or more RF ground return path members 184 coupled between a perimeter of the conductive body 124 and the grounded chamber bottom 108. Detailed description of RF ground return path members 184 may be found in U.S. patent application Ser. No. 10/919,457 filed Aug. 16, 2004, entitled "Method and Apparatus for Dechucking a Substrate", which is hereby incorporated by reference.

In one embodiment, at least the portion of the conductive body 124 may be covered with an electrically insulative coating to improve deposition uniformity without expensive aging or plasma treatment of the substrate support assembly 138. The conductive body 124 may be fabricated from metals or other comparably electrically conductive materials. The coating may be a dielectric material such as oxides, silicon nitride, silicon dioxide, aluminum dioxide, tantalum pentoxide, silicon carbide, polyimide, among others, which may be applied by various deposition or coating processes, including but not limited to, flame spraying, plasma spraying, high energy coating, chemical vapor deposition, spraying, adhesive film, sputtering and encapsulating. Detailed description of the coating may be found in U.S. patent application Ser. No. 10/435,182 filed May 9, 2003, entitled "Anodized Substrate Support", and U.S. patent application Ser. No. 11/182,168 filed Jul. 15, 2005, entitled "Reduced Electrostatic Charge by Roughening the Susceptor", which are hereby incorporated by reference. Alternatively, a top surface 180 of the conductive body 124 may be free of coating or anodizing.

In one embodiment, the conductive body 124 encapsulates at least one embedded heating element 132. At least a first reinforcing member 116 is generally embedded in the conductive body 124 proximate the heating element 132. A second reinforcing member 166 may be disposed within the conductive body 124 on the side of the heating element 132 opposite the first reinforcing member 116. The reinforcing members 116, 166 may be comprised of metal, ceramic or other stiffening materials. In one embodiment, the reinforcing members 116 and 166 are comprised of aluminum oxide fibers. Alternatively, the reinforcing members 116 and 166 may be comprised of aluminum oxide fibers combined with aluminum oxide particles, silicon carbide fibers, silicon oxide fibers or similar materials. The reinforcing members 116, 166 may include loose material or may be a pre-fabricated shape such as a plate. Alternatively, the reinforcing members 116, 166 may comprise other shapes and geometry. Generally, the reinforcing members 116, 166 have some porosity that allows aluminum to impregnate the members 116, 166 during a casting process described below.

The heating element 132, such as an electrode disposed in the substrate support assembly 138, is coupled to a power source 130 and controllably heats the substrate support assembly 138 and the substrate 140 positioned thereon to a desired temperature. Typically, the heating element 132 maintains the substrate 140 at a uniform temperature of about 150 to at least about 460 degrees Celsius. The heating element 132 is generally electrically insulated from the conductive body 124.

Figure 2:
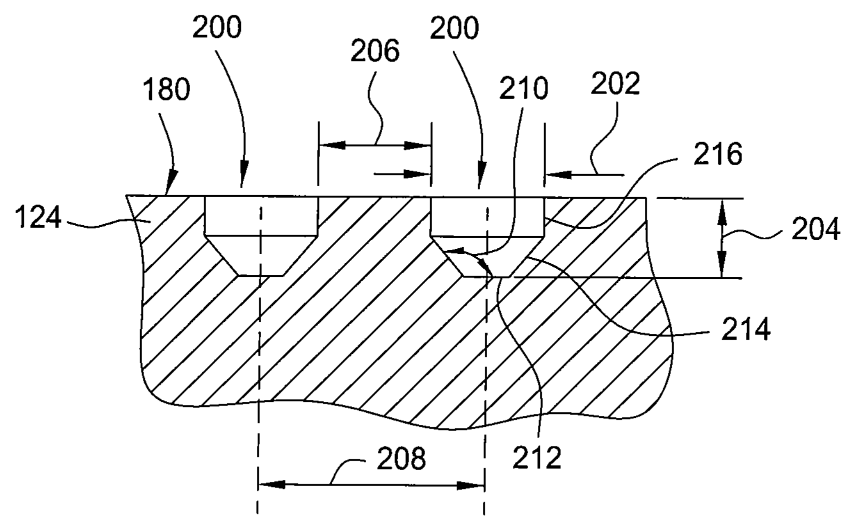
FIG. 2 is a partial sectional view of the substrate support of FIG. 1

The conductive body 124 has a lower side 126 opposite the top surface 180. The top surface 180 is configured to support the substrate 140 and heat to the substrate 140. The top surface 180 has a plan area of at least 0.25 square meters, for example, greater than 2.5 square meters and exceeding 6 square meters. The top surface 180 may be roughened (as shown in FIG. 2) to form spaces between the top surface 180 and the substrate 140. The roughened top surface 180 reduces capacitive coupling between the conductive body 124 and the substrate 140. In one embodiment, the top surface 180 may be a non-planar surface configured to be partially in contact with the substrate 140 during processing.

The lower side 126 has a stem cover 144 coupled thereto. The stem cover 144 generally is an aluminum ring coupled to the substrate support assembly 138 that provides a mounting surface for the attachment of the shaft 142 thereto.

The shaft 142 extends from the stem cover 144 and couples the substrate support assembly 138 to a lift system (not shown) that moves the substrate support assembly 138 between an elevated position (as shown) and a lowered position. A bellows 146 provides a vacuum seal between the process volume 112 and the atmosphere outside the chamber 102 while facilitating the movement of the substrate support assembly 138.

The substrate support assembly 138 additionally supports a circumscribing shadow frame 148. Generally, the shadow frame 148 prevents deposition at the edge of the substrate 140 and support assembly 138 so that the substrate does not stick to the substrate support assembly 138.

The substrate support assembly 138 has a plurality of holes 128 formed therethrough that accept a plurality of lift pins 150. The lift pins 150 are typically comprised of ceramic or anodized aluminum. Generally, the lift pins 150 have first ends 160 that are substantially flush with or slightly recessed from the top surface 180 of the substrate support assembly 138 when the lift pins 150 are in a normal position (i.e., retracted relative to the substrate support assembly 138). The first ends 160 are generally flared or otherwise enlarged to prevent the lift pins 150 from falling through the holes 128. Additionally, the lift pins 150 have a second end 164 that extends beyond the lower side 126 of the substrate support assembly 138. The lift pins 150 come in contact with the chamber bottom 108 and are displaced from the top surface 180 of the substrate support assembly 138, thereby placing the substrate 140 in a spaced-apart relation to the substrate support assembly 138.

In one embodiment, lift pins 150 of varying lengths are utilized so that they come into contact with the bottom 108 and are actuated at different times. For example, the lift pins 150 that are spaced around the outer edges of the substrate 140, combined with relatively shorter lift pins 150 spaced inwardly from the outer edges toward the center of the substrate 140, allow the substrate 140 to be first lifted from its outer edges relative to its center. In another embodiment, lift pins 150 of a uniform length may be utilized in cooperation with bumps or plateaus 182 positioned beneath the outer lift pins 150, so that the outer lift pins 150 are actuated before and displace the substrate 140 a greater distance from the top surface 180 than the inner lift pins 150. Alternatively, the chamber bottom 108 may comprise grooves or trenches positioned beneath the inner lift pins 150, so that the inner lift pins 150 are actuated after and displaced a shorter distance than the outer lift pins 150. Embodiments of a system having lift pins configured to lift a substrate in an edge to center manner from a substrate support that may be adapted to benefit from the invention are described in U.S. Pat. No. 6,676,761, which is hereby incorporated by reference.

FIG. 2 is a partial sectional view of the top surface 180 of the conductive body 124 illustrating one embodiment of a roll-formed indent 200. The roll-formed indent 200 generally is formed into the top surface 180 to create a gap or space between the conductive body 124 and the substrate to reduce capacitive coupling. The roll-formed indent 200 may have various geometric profiles and plan forms. In the embodiment depicted in FIG. 2, the roll-formed indent 200 has a square truncated pyramid shape. Other exemplary shapes include, not by way of limitation, truncated cones, conical, pyramidal, cubical and hemispherical, among others.

In the embodiment depicted in FIG. 2, the roll-formed indent 200 has a width 202 of between about 0.016 (0.406 millimeters) to about 0.48 inches (about 1.219 centimeters), such as about 0.032 inches (about 0.08128 centimeter). The pitch 208 between centers of adjacent roll-formed indents 200 may be about double the width 202. Thus, the portion of the top surface 180 between adjacent roll-formed indents 200 may be defined by a distance 206 of about 0.016 (0.406 millimeters) to about 0.48 inches (about 1.219 centimeters), such as about 0.032 inches (about 0.08128 centimeter).

The roll-formed indent 200 may extend to a depth 204 of between about 10 to about 20 mils (0.254 to about 0.508 millimeters) into the conductive body 124, such as about 16 mils (0.406 millimeters). The depth 204 is selected to be shallow enough to prevent displaced material from creating scratch inducing features on the top surface 180 while deep enough to provide good indent to indent repeatability.

In one embodiment, the roll-formed indent 200 includes an upper sidewall 216, a lower sidewall 214 and a bottom 212. The upper sidewall 216 is formed between the lower sidewall 214 and the top surface 180. The lower sidewall 214 is formed between the upper sidewall 216 and the bottom 202. The lower sidewall 214 and the bottom 202 intersect at an angle 210 greater than 90 degrees, such as between 120 and 150 degrees, to prevent particle trapping in the indent 200.

The roll-formed indents 200 are generally arranged in a regular (i.e., repeating) array. The array may be arranged in a grid, be nested or has another suitable repeating pattern.

Figure 3:
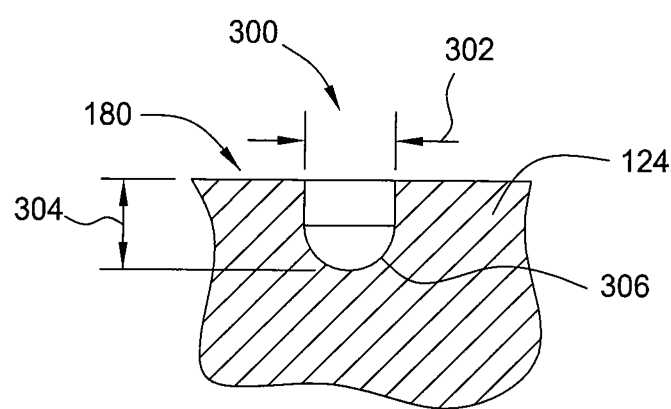
FIG. 3 is a partial sectional view of another embodiment of a substrate support.

FIG. 3 is a partial sectional view of the top surface 180 of the conductive body 124 illustrating another embodiment of a roll-formed indent 300. The roll-formed indent 300 includes a cylindrical sidewall 302 and a bottom 306. The bottom 306 may be a full radius, or sufficiently rounded to prevent particle trapping. The roll-formed indent 300 has a depth 304 which is within the range described for the indent 200 described above.

Figure 4:
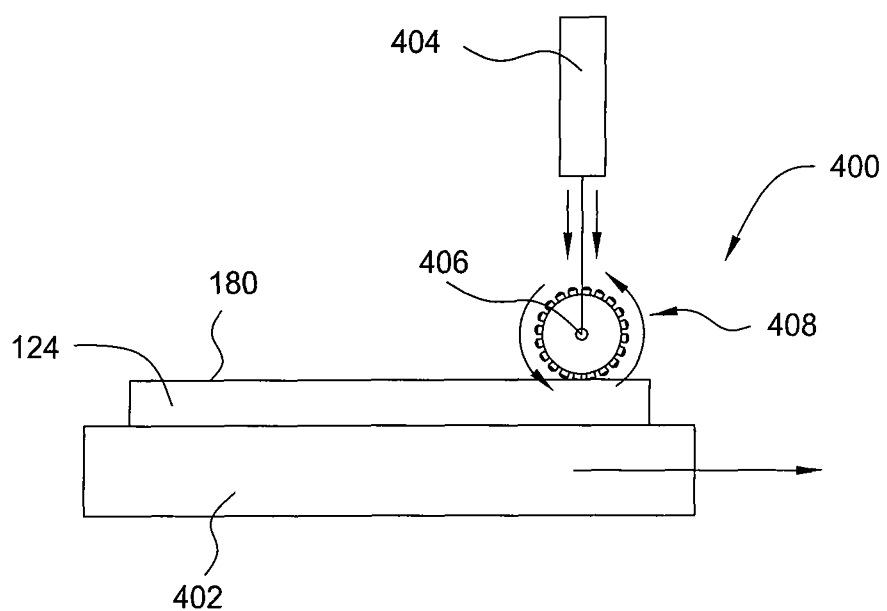
FIG. 4 is a schematic illustration of one embodiment of a method for roll-forming a surface of a substrate support.
Figure 5A:
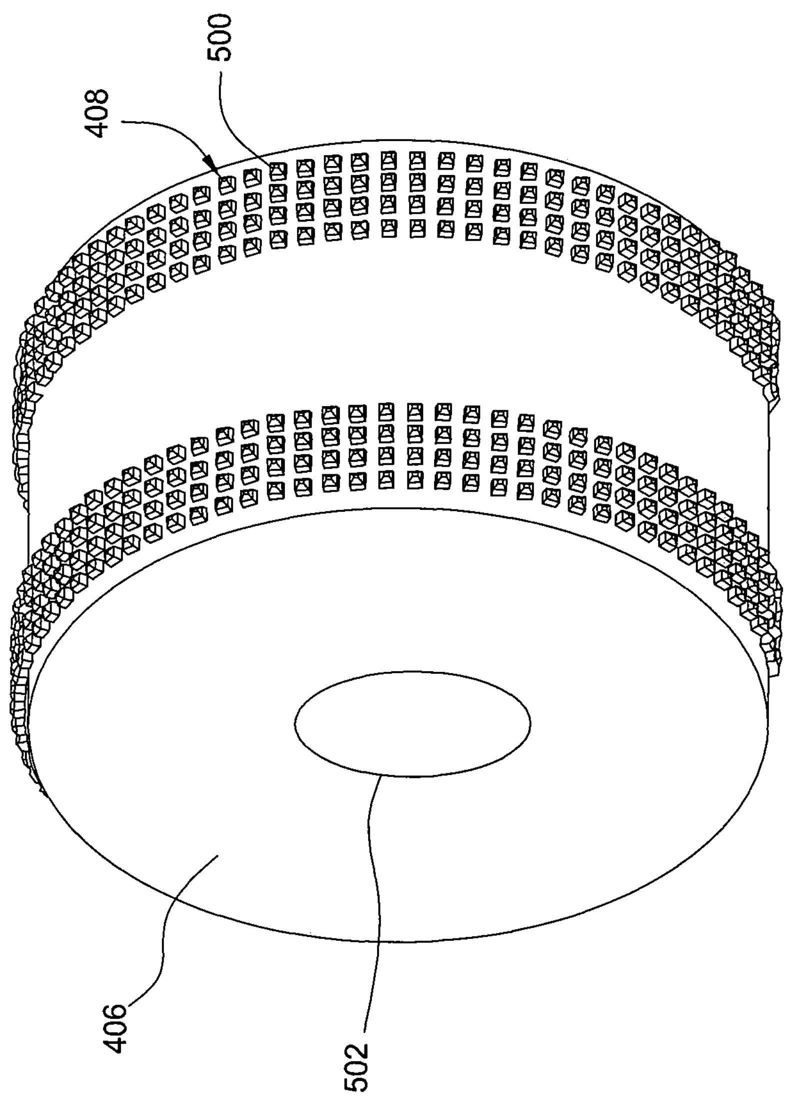
FIGS. 5A-D are various partial views of the roll-forming tool of FIG. 4
Figure 5B:
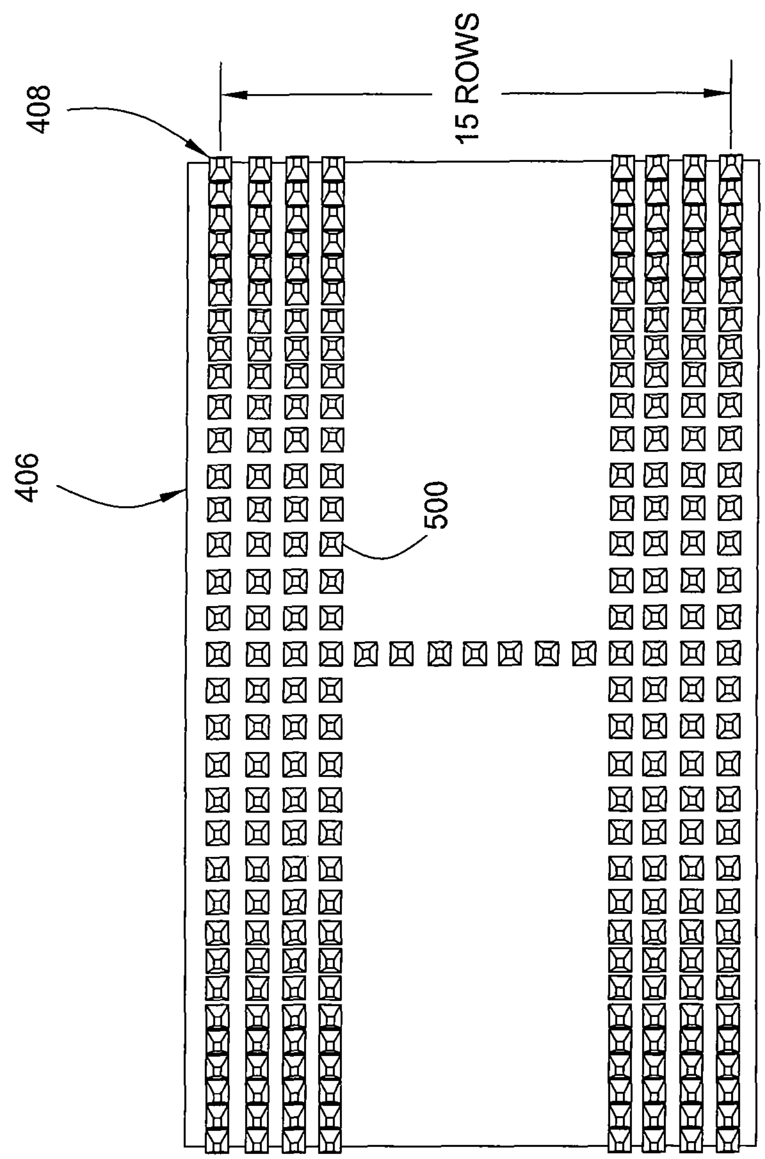
Figure 5C:
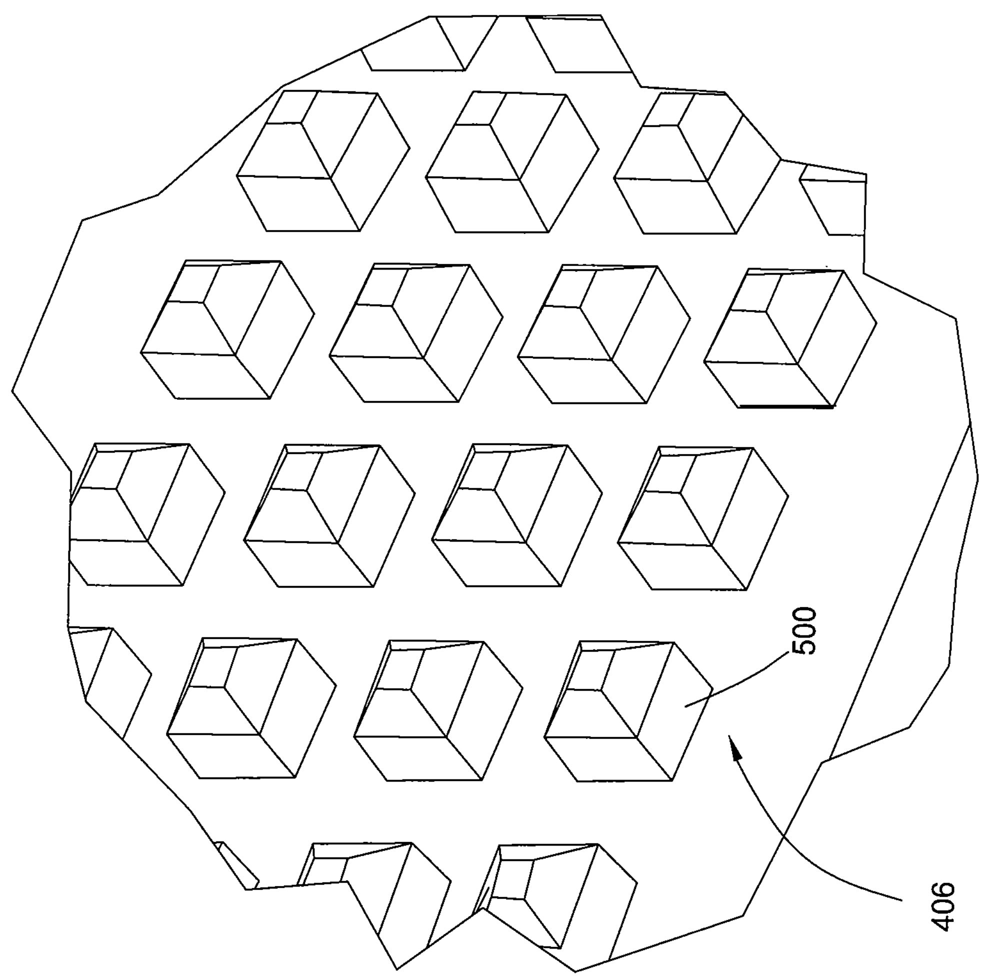
Figure 5D:
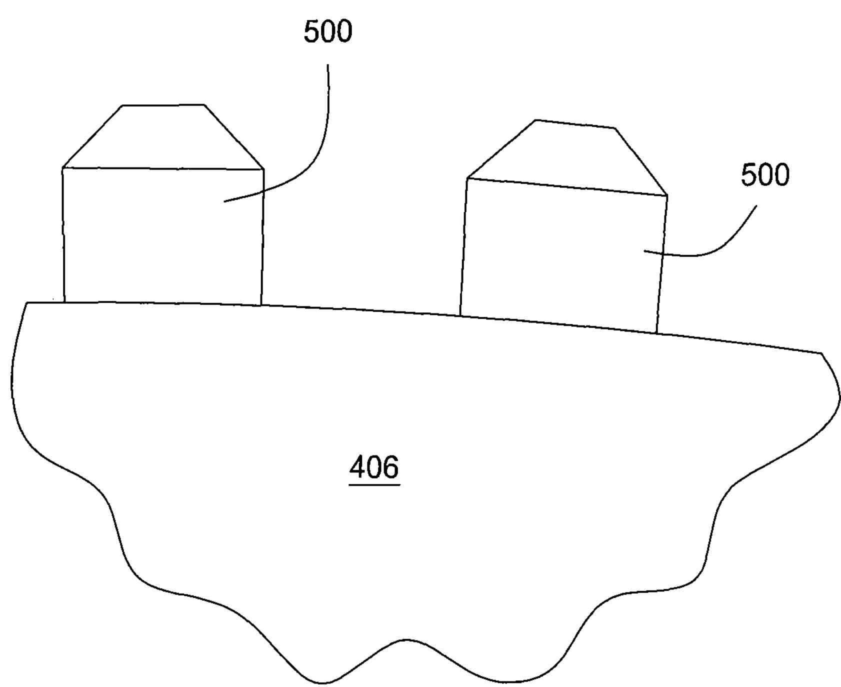

FIG. 4 is a schematic illustration of one embodiment of a method for fabricating the roll-formed surface 180 of the substrate support assembly 138. The conductive body 124 of the substrate support assembly 138 is place on a platen 402 of a roll-forming tool 400. The roll-forming tool 400 has an actuator 404 that supports a roll-forming head 406 above the platen 402. The actuator 404 is utilized to control the elevation of the roll-forming head 406 above the platen 402, and the force exerted by the roll-forming head 406 on the conductive body 124 positioned on the platen 402. The roll-forming head 406 has a pattern 408 which is transferred to top surface 180 by advancing the platen 402 and conductive body 124 laterally while the roll-forming head 406 is in contact with the top surface 180.

FIGS. 5A-D are various views of the roll-forming head 406. The roll-forming head 406 has a cylindrical body having a center hole 502 to accommodate a bearing or shaft that facilitates the rotation of the roll-forming head 406 when in use. The pattern 408 of the roll-forming head 406 include a plurality of male projections 500 that are utilized to displace the material of the conductive body 124 and form the indents 200 when the roll-forming head 406 is pressed against the top surface 180. The roll-forming head 406 and male projections 500 are fabricated from a material harder than the material of the substrate support assembly 138, such as a tool steel.

Figure 6:
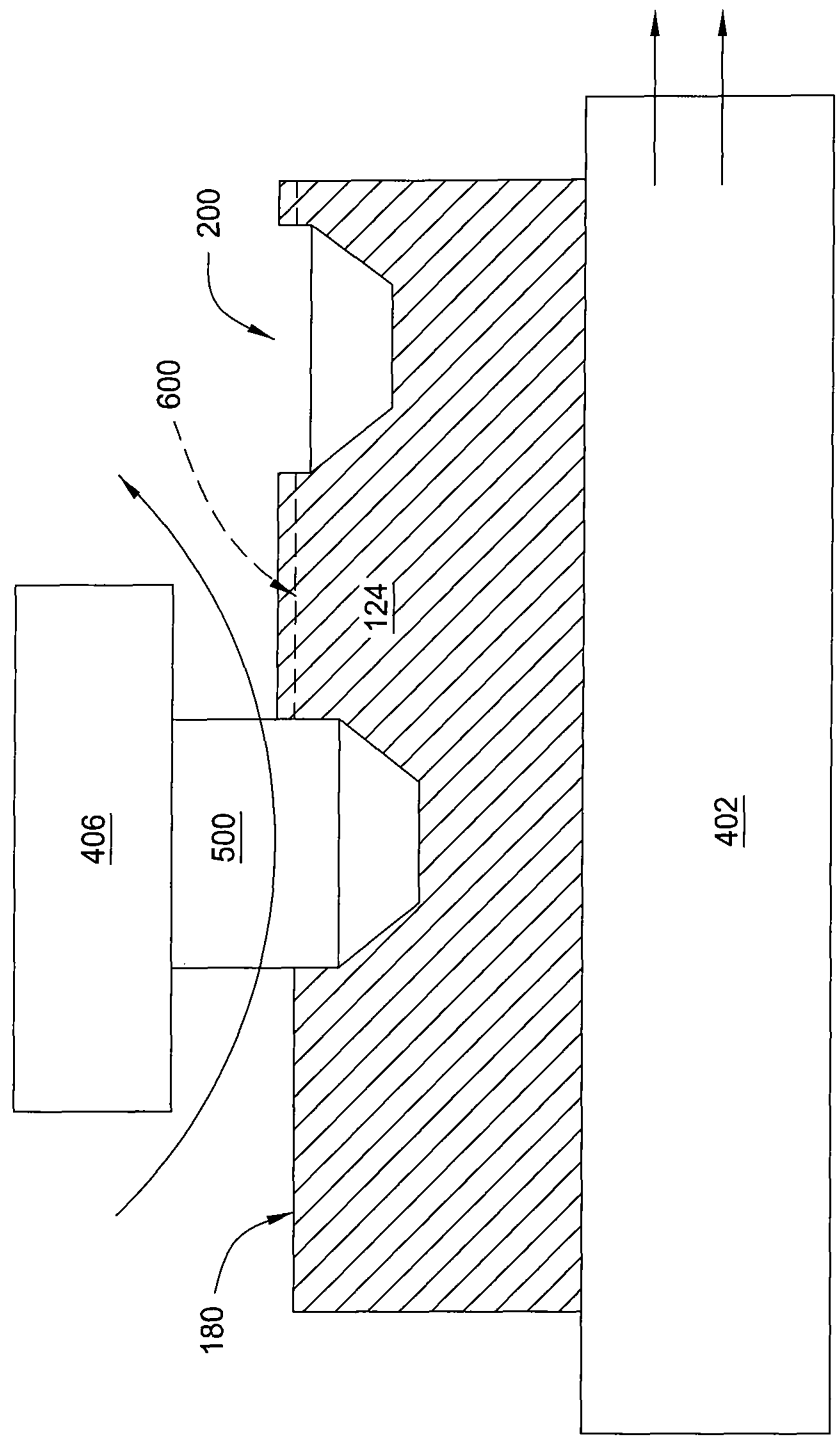
FIG. 6 is a schematic illustration of the roll-forming tool of FIG. 4 in contact with a top surface of a substrate support.

FIG. 6 is a schematic illustration of the roll-forming head 406 in contact with the top surface 180 of the substrate support assembly 138. The force required to transfer the pattern 408 to the top surface 180 will vary with the temper of the aluminum, the size and shape of the male projection 500 and desired depth of the resultant indent 200. The exemplary indent depth values provided herein are for a conductive body 124 fabricated from 6061 T6 aluminum. As the platen 402 is advanced laterally while the roll-forming head 406 is in contact with the top surface 180, the roll-forming head 406 rotates to sequentially press the male projections 500 into the top surface 180 so that the inverse of the pattern 408 is transferred to the top surface 180.

Material of the conductive body 124 displaced by the indent 200 (shown as displaced material 600) raises the height of the top surface 180 adjacent the indent 200. The depth 204 of the indent 200 is selected such that the displaced material 600 forms a generally smooth surface which added about 2 mils to the thickness of the conductive body 124. If too much material is displaced, the cold-worked displaced material 600 may form a locally elevated hardened bump (not shown) on the top surface 180 which may be a source of substrate scratching.

Figure 7:
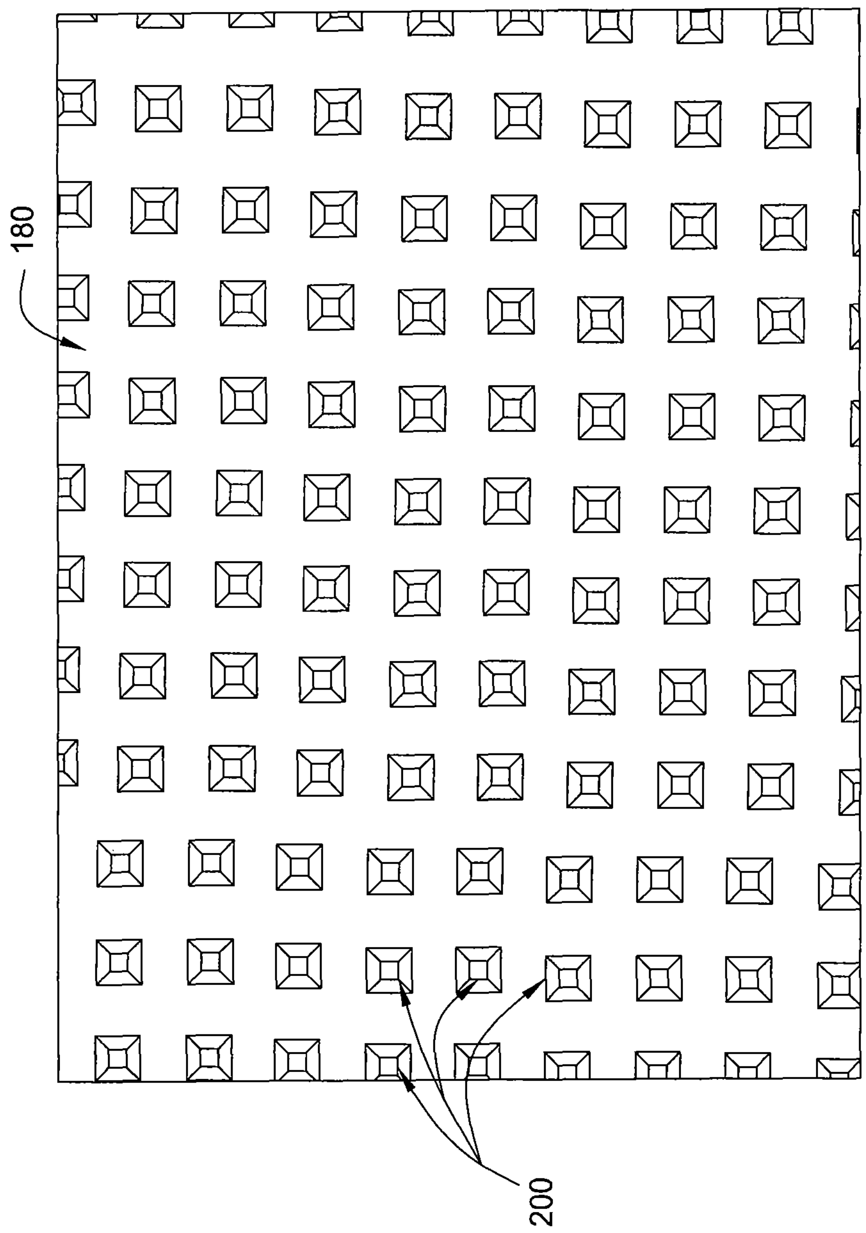
FIG. 7 is a partial top view of one embodiment of a roll-formed surface.

FIG. 7 is a partial top view of one embodiment of a roll-formed top surface 180. In the illustrated embodiment, the indents 200 are arranged in a grid pattern. Since the patterned is produced by a roll-forming technique, the pattern is uniform and repeatable, both is indent distribution and indent volume/geometric. The high uniformity of the indents 200 promotes process uniformity.

While the foregoing is directed to embodiments of the present invention, other and further embodiments of the invention may be devised without departing from the basic scope thereof, and the scope thereof is determined by the claims that follow.

What is claimed is:

1. A substrate support for use in a plasma reactor, comprising:

an electrically conductive plate-shaped aluminum body having a top surface defining a top plane and a bottom surface define a bottom plane, the bottom surface being opposite the top surface, the electrically conductive aluminum body configured to be an electrode of the plasma reactor, wherein the top surface is configured for supporting a substrate thereon, the top surface having an array of indents, each indent having a bottom, wherein the indents are impressed on the top surface and arranged in a repeating pattern across a substantial portion of the top surface;

raised portions formed from material of the electrically conduct aluminum body between adjacent indents, the raised portion being raised relative to the top plane defined by the top surface; and a heating element disposed in the electrically conductive aluminum body.

2. The substrate support of claim 1, wherein the bottom of the indents have a depth of between about 10 to about 20 mils (0.254 to about 0.508 millimeters) from the top surface.

3. A plasma reactor, comprising:

a chamber body having a process volume;

a showerhead disposed in the process volume and configured to direct flow of process gases into the process volume; and the substrate support of claim 1.

4. The plasma reactor of claim 3, wherein the bottom of the indents have a depth of between about 10 to about 20 mils (0.254 to about 0.508 millimeters) from the top surface.

5. The plasma reactor of claim 3 further comprising:

an RF power source coupled to the showerhead.

6. The substrate support of claim 1, wherein the raised portion adds about 2 mils thickness to the electrically conductive aluminum body.

7. The substrate support of claim 1, wherein the top surface is roughened.

8. A substrate support assembly formed by a method comprising:

roll-forming an array of indents across a top surface of a plate-shaped aluminum body of the substrate support assembly, the substrate support assembly having a bottom surface defining a bottom plane, the top surface of the aluminum body defining a top plane and configured to support a substrate having a surface area exceeding 550 mm×650 mm; and forming raised portions adjacent each of the roll-formed indents, the raised portion being raised relative to the top plane defined by the top surface.

9. The substrate support of claim 8, wherein the roll-forming the array of indents in the top surface further comprises:

forming the indents in a repeating pattern.

10. The substrate support of claim 8, wherein the roll-forming the array of indents in the top surface further comprises:

forming the indents in a grid pattern.

11. The substrate support of claim 8, wherein the roll-forming the array of indents in the top surface further comprises:

displacing material adjacent each of the roll-formed indents material to from bumps.

12. The substrate support of claim 8, further comprising: roughening the top surface of the substrate support assembly.

13. The substrate support of claim 8, wherein a heating element is disposed within the aluminum body.

14. The substrate support of claim 1, wherein the bottom of the indents is continuous with the top surface.

15. The substrate support of claim 1, wherein the substrate support includes a plurality of lift pins.

* * * * *